(12) United States Patent
Bogi et al.

(10) Patent No.: US 10,784,842 B2
(45) Date of Patent: Sep. 22, 2020

(54) VOLTAGE LEVEL SHIFTING CIRCUITRY (71) Applicant: Arm Limited, Cambridge (GB)

(72) Inventors: Seshagiri Rao Bogi, Bangalore (IN);
Vinay Chenani, Bangalore (IN);
Biswanath Nayak, Bangalore (IN);
Vijaya Kumar Vinukonda, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/239,498

(22) Filed: Jan. 3, 2019

(65) Prior Publication Data
US 2020/0220529 A1 Jul. 9, 2020

(51) Int. Cl.
H03K 3/02 (2006.01)
H03K 19/094 (2006.01)
H03K 19/018 (2006.01)
H03K 5/003 (2006.01)

(52) U.S. Cl.
CPC ............ H03K 3/02 (2013.01); H03K 5/003 (2013.01); H03K 19/01812 (2013.01); H03K 19/09421 (2013.01)

(58) Field of Classification Search
CPC .................................. H03K 5/02; H03K 5/003
See application file for complete search history.

(56) References Cited

U.S. PATENT DOCUMENTS 7,564,289 B2 * 7/2009 Imura .................... H03K 3/013
327/333
7,696,805 B2 * 4/2010 Thorp ................ H03K 3/35613
326/68

* cited by examiner

Primary Examiner — Hai L Nguyen
(74) Attorney, Agent, or Firm — Pramudji Law Group PLLC; Ari Pramudji (57) ABSTRACT Various implementations described herein refer to an integrated circuit having a first stage and a second stage. The first stage has first transistors arranged as a diode, a first latch and feedback assist to facilitate shifting an input voltage in a first voltage domain to an output voltage in a second voltage domain. The first stage uses the diode and the first latch to reduce contention between the first latch and input transistors. The diode, the first latch and the feedback assist enable activation of the input transistors with the input voltage. The second stage has second transistors arranged as a second latch followed by output buffers that provide a buffered output voltage as feedback to the feedback assist of the first stage.

20 Claims, 5 Drawing Sheets

VOLTAGE LEVEL SHIFTING CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuitry, a voltage level shifter is an important circuit in many interface circuits that have input and output (IO) at different voltage levels. Sometimes, voltage level shifting may be challenging when an input voltage level is near threshold levels of a device because the device may not turn on even when the device size is increased.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to a multi-stage voltage level shifting circuitry and various schemes and techniques for providing a high performance level shifter with a diode-drop latch with feedback assist. In some implementations, the level shifter refers to an integrated circuit having the diode-drop latch with feedback assist that supports ultra-low voltage and high frequencies for improved performance. For instance, the schemes and techniques described herein are adapted to support level shifting within a voltage range of ultra-low core voltage (e.g., 0.45V) to input-output (IO) voltage (e.g., 1.98V) with high performance of up to 300 MHz with less area. As described herein, the voltage level shifter (LS) has multiple stages, such as, e.g., a first stage and a second stage. For instance, the first stage has a diode-based latch along with feedback assist branches that enable the level shifter to turn on at near threshold core voltage (VDD) level along with high performance of up to 300 MHz. Also, the second stage has a latch followed by one or more buffers.

Various implementations of multi-stage level shifting circuitry for providing a high performance level shifter with a diode-drop latch with feedback assist will now be described in detail herein with reference to FIGS. 1A-3.

Figure 1A:
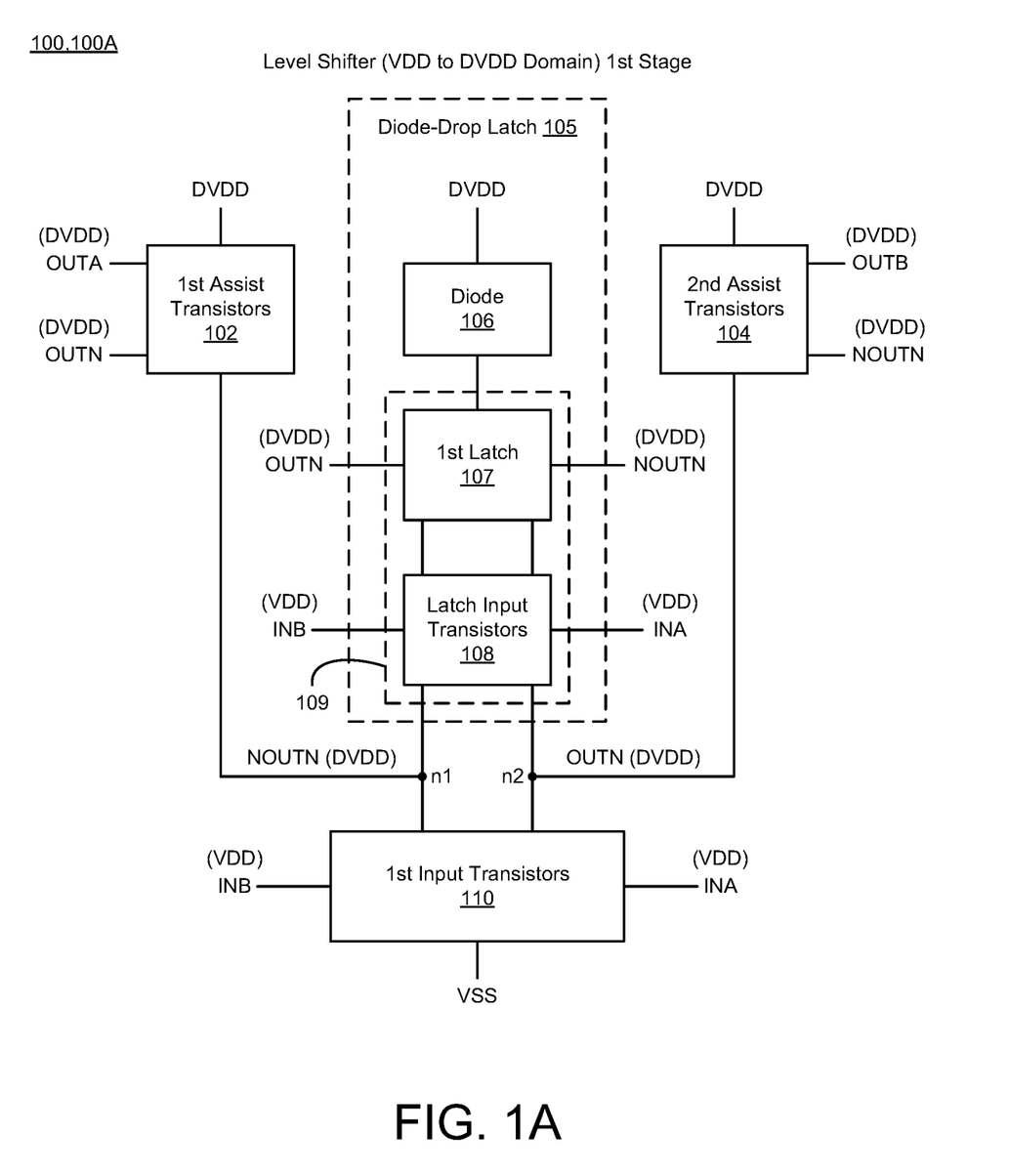
FIGS. 1A-1B illustrate a diagram of a level shifter having a diode-drop latch in accordance with various implementations described herein.
Figure 1B:
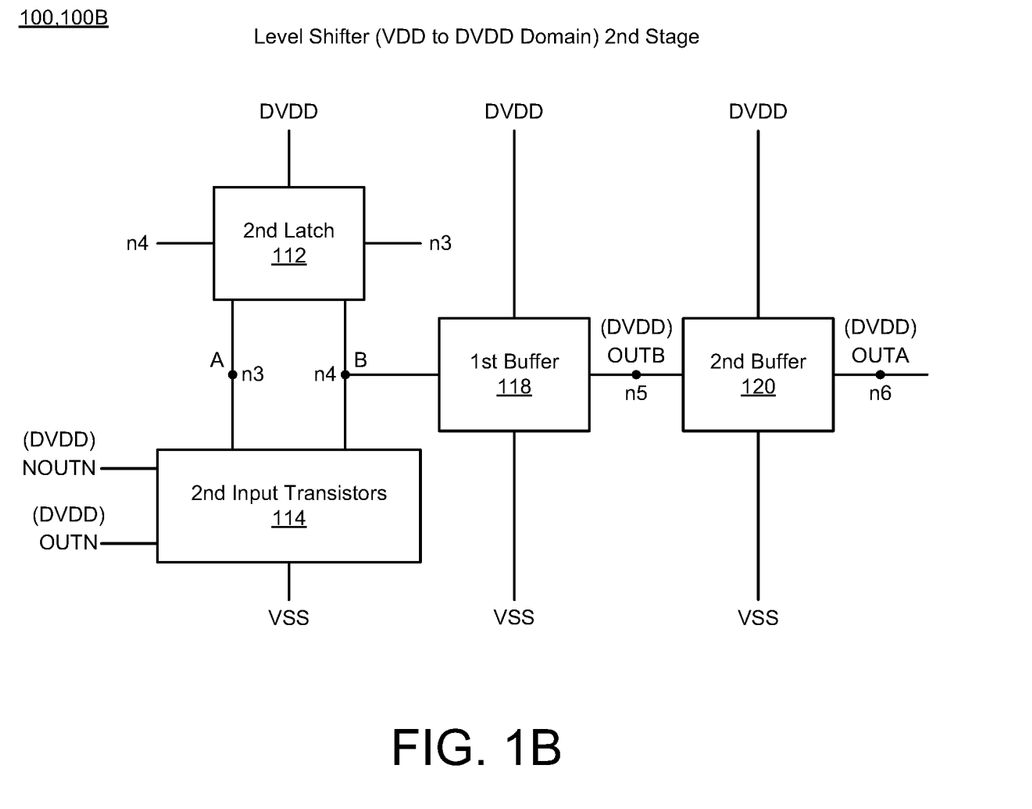

FIGS. 1A-1B illustrate a diagram of a level shifter 100 having a diode-drop latch 105 in accordance with various implementations described herein. In particular, FIG. 1A shows a first stage 100A of the level shifter 100 that includes the diode-drop latch 105, and FIG. 1B shows a second stage 100B of the level shifter 100 that is coupled to the first stage 100A. The level shifter 100 may be implemented as an integrated circuit with the first stage 100A and the second stage 100B integrated together in a combined circuit. The first stage 100A and the second stage 100B may share the same source voltage (DVDD) and the same ground (VSS). The first stage 100A and the second stage 100B may operate simultaneously, and once the first stage 100A starts triggering, the performance of the second stage 100B may be improved. In some instances, the level shifter 100 may use only thick-oxide devices.

Figure 2A:
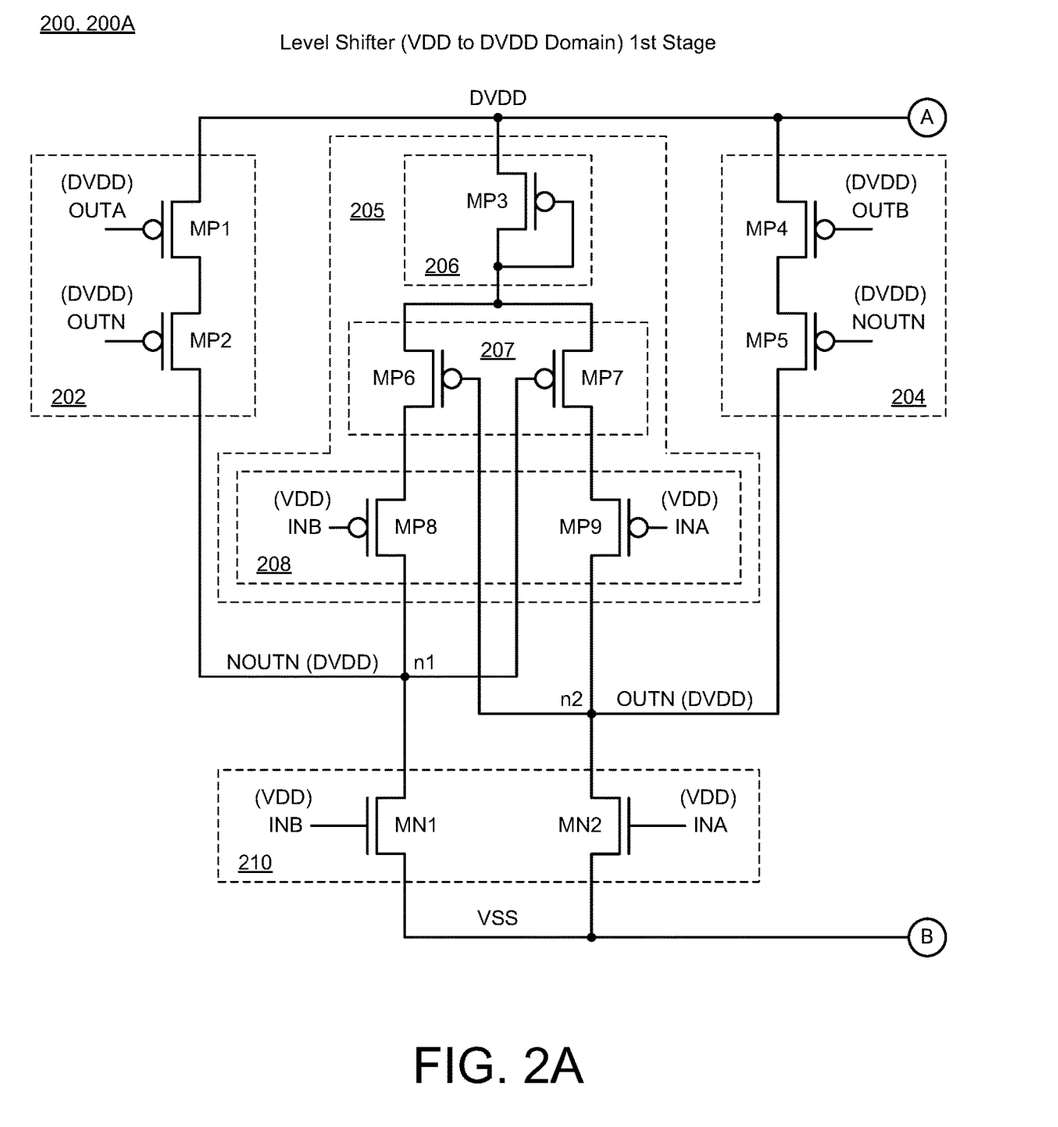
FIGS. 2A-2B illustrate another diagram of a level shifter having a diode-drop latch in accordance with various implementations described herein.

As shown in FIG. 1A, the level shifter 100 may include the first stage 100A with first transistors arranged as a diode 106, a first latch 107, and feedback assist 102, 104 to facilitate shifting an input voltage (INA, INB) in a first voltage domain (VDD) to an output voltage (OUTN, NOUTN) in a second voltage domain (DVDD) that is greater than the first voltage domain (VDD). The first stage 100A may use the diode 106 and the first latch 107 to reduce contention between the first latch 107 and first input transistors 110. In addition, the diode 106, the first latch 107, and the feedback assist 102, 104 may enable activation of the first input transistors 110 with the input voltage (INA, INB).

The diode-drop latch 105 may include a combination of the diode 106 and the first latch 107. The diode 106 may include a diode-coupled transistor (e.g., MP3 in FIG. 2A) that is arranged to operate as the diode 106, and the first latch 107 may include multiple transistors (e.g., MP6, MP7 in FIG. 2A) that are arranged to operate as the first latch 107. The feedback assist 102, 104 of the first stage 100A may include first feedback assist transistor circuitry (e.g., MP1, MP2 in FIG. 2A) and second feedback assist transistor circuitry (e.g., MP4, MP5 in FIG. 2A) that are arranged to receive the output voltage (OUTN, NOUTN) and the buffered output voltage (OUTA, OUTB) and also provide the output voltage (OUTN, NOUTN) to the first input transistors 110. In some instances, the output of the level shifter (LS) 100 is taken from the OUTA and OUTB nodes.

The first input transistors 110 of the first stage 100A may include a first input transistor (e.g., MN1 in FIG. 2A) and a second input transistor (e.g., MN2 in FIG. 2A). The first input transistor (MN1 in FIG. 2A) may be activated by a first input voltage (INB) of the input voltages (INA, INB), and the second input transistor (MN2 in FIG. 2A) may be activated by a second input voltage (INB) of the input voltages (INA, INB).

The first latch 107 may include a latch circuit having latch input transistors 108 that are coupled between the first latch 107 and the first input transistors 110. The first latch 107 and the latch input transistors 108 may be integrated together in a combined latch circuit 109. The latch input transistors 108 may include a first latch input transistor (e.g., MP8 in FIG. 2A) and a second latch input transistor (e.g., MP9 in FIG. 2A). The first latch input transistor (MP8 in FIG. 2A) may be activated by the first input voltage (INB) of the input voltages (INA, INB), and the second latch input transistor (MP9 in FIG. 2A) may be activated by the second input voltage (INA) of the input voltages (INA, INB).

As shown in FIG. 1B, the level shifter 100 may include the second stage 100B with second transistors arranged as a second latch 112 followed by output buffers 118, 120 that provide a buffered output voltage (OUTA, OUTB) as feedback (e.g., 216 in FIG. 2B) to the feedback assist 102, 104 of the first stage 100A. The second stage 100B may include second input transistors 114 including a third input transistor (e.g., MN3 in FIG. 2B) and a fourth input transistor (e.g., MN4 in FIG. 2B). The third input transistor (MN3 in FIG.

2B) may be activated by a first output voltage (NOUTN) of the output voltages (OUTN, NOUTN), and the fourth input transistor (MN4 in FIG. 2B) may be activated by a second output voltage (OUTN) of the output voltages (OUTN, NOUTN).

A first output buffer 118 of the output buffers 118, 120 of the second stage 100B may provide a first output voltage (OUTB) of the output voltage (OUTA, OUTB) as a first feedback voltage of the feedback (216 in FIG. 2B) to the feedback assist 102, 104 of the first stage 100A. Also, a second output buffer 120 of the output buffers 118, 120 of the second stage 100B may provide a second output voltage OUTA of the output voltage (OUTA, OUTB) as a second feedback voltage of the feedback (216 in FIG. 2B) to the feedback assist 102, 104 of the first stage 100A.

The second transistors of the second stage 100B may be arranged to support operating frequencies above a predetermined operating frequency (e.g., operating frequencies above 200 MHz). The second stage 100B may use the second latch 112 to enable the operating frequencies above the predetermined operating frequency, and the second stage 100B may use the output buffers 118, 120 to provide the feedback (216 in FIG. 2B) in the second voltage domain DVDD to the first stage 100A. In some cases, the higher frequencies may refer to an upper boundary of 300 MHz, and in other cases, the higher frequencies may refer to a range of pulse frequencies that are between 200 MHz and 300 MHz in reference to VDD and DVDD. Also, in some cases, the higher frequencies may be with respect to the input voltages (INA/INB) at the core voltage level VDD and the output voltages (OUTN/NOUTN and OUTA/OUTB) at the higher output voltage level DVDD.

In some implementations, the input voltage (INA, INB) in the first voltage domain (VDD) may refer to a low core voltage (VDD), and the output voltage (OUTN, NOUTN) in the second voltage domain (DVDD) may refer to a high output voltage (DVDD) that is greater than the low core voltage (VDD). In some instances, the first voltage domain (VDD) may refer to a voltage range of 0.45V to 1.0V, and the second voltage domain (DVDD) may refer to a voltage range of 1.08V to 1.98V. In this instance, the level shifter 100 is implemented as an upshifting level shifter that upshifts the low core voltage VDD to a higher output voltage DVDD, which may be referred to as an input-output (10) operating voltage.

In some instances, the level shifter 100 may be reconfigured and implemented as a downshifting level shifter that may be used to downshift a higher input voltage DVDD (which may be referred to as an IO input voltage) to a lower core voltage VDD. In these instances, the downshifting level shifter may be configured for supporting a higher DVDD input voltage range of 1.08V to 1.98V and a lower VDD output voltage range of 0.675V to 1.0V.

Figure 2B:
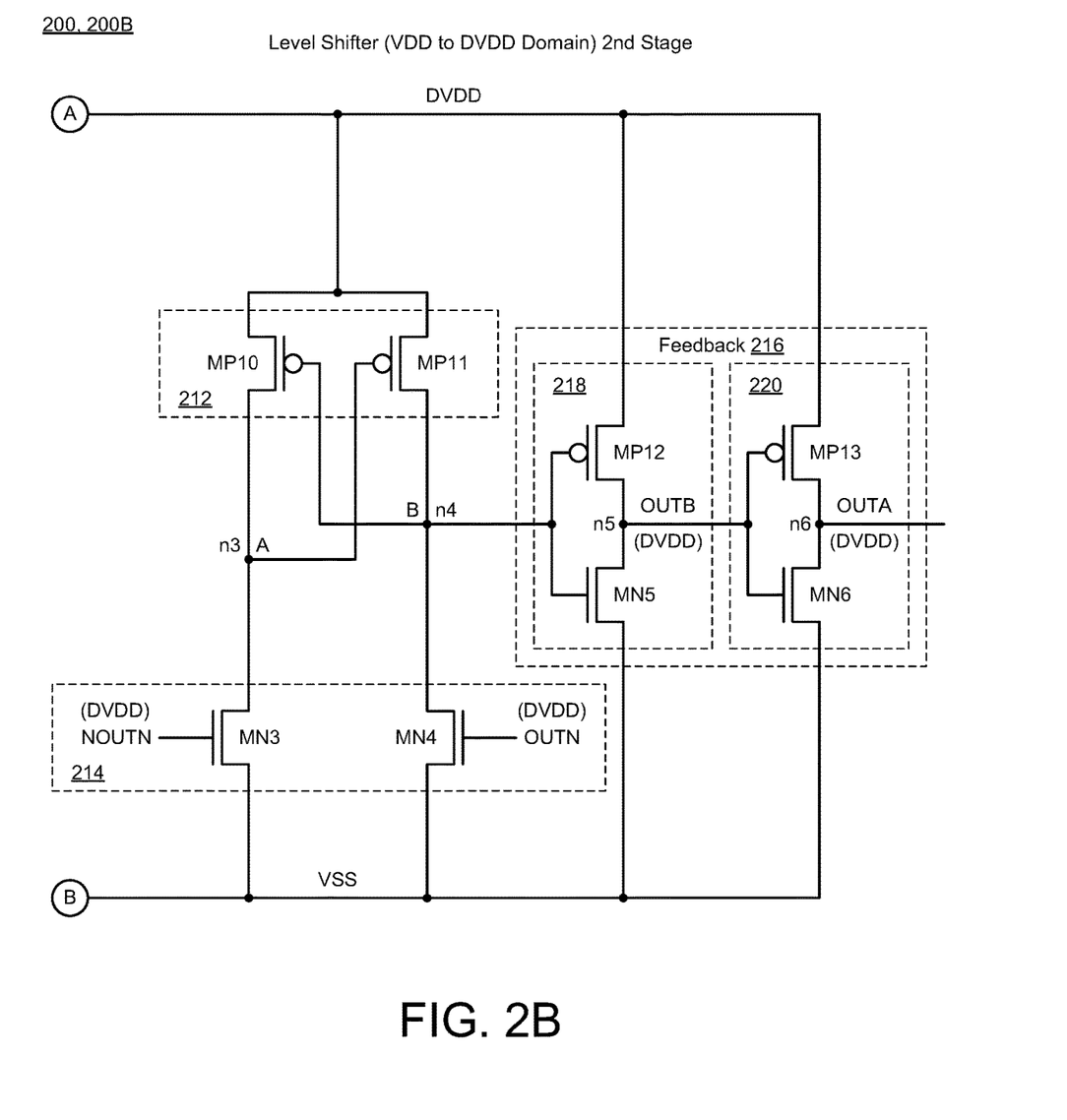

FIGS. 2A-2B illustrate another diagram of a level shifter 200 having a diode-drop latch 205 with feedback assist (202, 204) in accordance with various implementations described herein. In particular, FIG. 2A shows a first stage 200A of the level shifter 200 with the diode-drop latch 205 and the feedback assist (202, 204), FIG. 2B shows a second stage 200B of the level shifter 200. Various components in FIGS. 2A-2B are similar in scope, function and operation to components in FIG. 1A-1B. The level shifter 200 may be implemented as an integrated circuit with the first stage 200A and the second stage 200B integrated together in a combined circuit. As shown in FIGS. 2A-2B, the first stage 200A is coupled to the second stage 200B via source voltage DVDD at circled element A, and the first stage 200A is coupled to the second stage 200B via ground VSS at circled element B. In some instances, the level shifter 200 only uses thick-oxide devices.

As shown in FIG. 2A, the level shifter 200 may include the first stage 200A having first transistors arranged to facilitate shifting a core voltage in a first voltage domain (VDD at INA, INB) to an input-output (IO) voltage in a second voltage domain that is greater than the first voltage domain (DVDD at OUTN, NOUTN and/or DVDD at OUTA, OUTB). Also, the first stage 200A may include the diode-drop latch 205 that uses a diode 206, a first latch 207 and the feedback assist (202, 204) (e.g., the first latch 207 may enable shifting of the low core voltage VDD) that are arranged to reduce contention between the first latch 207 and first input transistors 210 (e.g., between MP6/MN1 and MP7/MN2) and also to enable turn-on of the first input transistors 210 (MN1 and/or MN2) at the low core voltage (VDD).

In some instances, the latch input transistors 208 with the feedback assist (202, 204) enables shifting of the low core voltage VDD to help reduce contention between the first latch 107 and the first input transistors 110 (e.g., between MP6/MN1 and MP7/MN2 of FIG. 2A) and to help enable turn-on or activation of the first input transistors 110 (MN1 and/or MN2 of FIG. 2A) at the low core voltage (VDD). The core voltage (INA, INB) in the first voltage domain (VDD) refers to a low core voltage (VDD), and the IO voltage (OUTN, NOUTN) in the second voltage domain (DVDD) refers to a high output voltage (DVDD) that is greater than the low core voltage (VDD).

The diode-drop latch 205 may be coupled between the source voltage (DVDD) and nodes (n1, n2) such that the diode 206 is coupled between the source voltage (DVDD) and the first latch 207, and the latch input transistors 208 are coupled between the first latch 207 and the nodes (n1, n2). The diode 206 includes transistor MP3 (PMOS) that is coupled together to operate as a diode. Also, the first latch 207 includes transistor MP6 (PMOS) that is activated by node (n2), which provides the output voltage (OUTN), and the first latch 207 also includes transistor MP7 (PMOS) that is activated by node (n1), which provides the output voltage (NOUTN). In this instance, as shown, the first latch transistors MP6, MP7 are cross-coupled transistors. In addition, the latch input transistors 208 include transistor MP8 that is coupled between transistor MP6 and node (n1), and the latch input transistors 208 include transistor MP9 that is coupled between transistor MP7 and node (n2). Generally, as known in the semiconductor industry, PMOS refers to a P-type MOS (metal-oxide-semiconductor) transistor, and NMOS refers to an N-type MOS transistor.

The level shifter 200 includes feedback assist 202, 204 having first feedback assist transistors MP1, MP2 and second feedback assist transistors MP4, MP5. As shown, the first feedback assist transistors MP1, MP2 are coupled in series between source voltage (DVDD) and node (n1), and the second feedback assist transistors MP4, MP5 are coupled in series between the source voltage (DVDD) and node (n2). In addition, the feedback assist transistor MP1 may be activated with buffered output signal OUTA, and the feedback assist transistor MP2 may be activated with output signal OUTN. Also, the feedback assist transistor MP4 may be activated with buffered output signal OUTB, and the feedback assist transistor MP5 may be activated with output signal NOUTN. In reference to the buffered output signals at node n5 and node n6, OUTB at node n5 is a complement (or out of phase) to OUTA at node n6, and in reference to the output signals at node n1 and node n2, NOUTN at node n1 is a complement (or out of phase) to OUTN at node n2.

Also, the first input transistors 210 include transistor MN1 (NMOS) that is coupled between node (n1) and ground (VSS), and the first input transistors 210 includes transistor MN2 (NMOS) that is coupled between node (n2) and ground (VSS). As shown in FIG. 2A, the transistor MN1 (NMOS) may be activated with input signal (INB), and the transistor MN2 (NMOS) may be activated with input signal (INA). In reference to input signals (INA, INB), the input signal INA is a complement (or out of phase) to the input signal INB.

As shown in FIG. 2B, the level shifter 200 may include the second stage 200B having second transistors arranged to (e.g., improve performance by enhancing or providing) provide support for higher frequencies (e.g., with respect to the input INA/INB at core voltage level VDD and the output OUTN/NOUTN at higher output voltage DVDD). The second stage 200B may use a second latch 212 to enable the higher frequencies, and the second stage 200B may use output buffers 218, 220 to provide feedback voltage 216 of a higher output voltage (OUTA, OUTB) to the first stage 200A.

In some implementations, the diode-drop latch 205 of the first stage 200A includes a diode-coupled transistor (MP3) that is arranged to operate as the diode 206, and the diode-drop latch 205 includes multiple transistors MP6, MP7 that are arranged to operate as the first latch 207. The diode-drop latch 205 of the first stage 200A includes latch input transistors 208 that are coupled between the first latch 207 and the first input transistors 210. The latch input transistors 208 may include a first latch input transistor MP8 and a second latch input transistor MP9. The first latch input transistor MP8 may be activated by a first input voltage (INB) of the input voltages (INA, INB), and the second latch input transistor MP9 may be activated by a second input voltage (INA) of the input voltages (INA, INB).

In some implementations, the second transistors of the second stage 200B are arranged to support operating frequencies above a predetermined operating frequency (e.g., operating frequencies above 200 MHz). The second stage 200B may use the second latch 212 to enable the operating frequencies above the predetermined operating frequency, and the second stage 200B may use the output buffers 218, 220 to provide the feedback 216 in the second voltage domain (DVDD) to the first stage 200A.

The second latch 212 includes transistor MP10 (PMOS) that is coupled between the source voltage DVDD and node A (n3), and also the second latch 212 includes transistor MP11 (PMOS) that is coupled between the source voltage DVDD and node B (n4). Also, as shown in FIG. 2B, the transistor MP10 (PMOS) may be activated by node B (n4), and the transistor MP11 (PMOS) may be activated by node A (n3). In this instance, the second latch transistors MP10, MP11 are arranged as cross-coupled transistors.

Also, as shown, the second input transistors 214 include transistor MN3 (NMOS) that is coupled between node A (n3) and ground (VSS), and the second input transistors 214 include transistor MN4 (NMOS) that is coupled between node B (n4) and ground (VSS). As shown, the transistor MN3 (NMOS) may be activated with output signal (NOUTN), and the transistor MN4 (NMOS) may be activated with output signal (OUTN).

Also, the output buffers 218, 220 include a first buffer 218 that may be implemented with a first inverter having transistors MP12, MN5, and the output buffers 218, 220 include a second buffer 220 that may be implemented with a second inverter having transistors MP13, MN6. As shown, in reference to the first buffer 218, the transistor MP12 (PMOS) is coupled between the source voltage (DVDD) and node (n5), and also, the transistor MN5 (NMOS) is coupled between the node (n5) and ground (VSS). Further, in reference to the second buffer 220, the transistor MP13 (PMOS) is coupled between the source voltage (DVDD) and node (n6), and also, the transistor MN6 (NMOS) is coupled between the node (n6) and ground (VSS). The transistors MP12, MN5 are activated with node voltage from node B (n4), and the transistors MP13, MN6 are activated with node voltage from node (n5). Also, as shown, the transistors MP13, MN6 are activated with node (n5), which provides the buffered output voltage (OUTB), and when activated, the transistors MP13, MN6 provide the buffered output voltage OUTA at node (n6) based on the node voltage OUTB from node (n5).

In various implementations, the level shifter 200 having the first stage 200A shown in FIG. 2A and the second stage 200B shown in FIG. 2B may operate as follows.

Input Toggling:

From an initial DC low voltage state with INA=0, INA may toggle to a high voltage state, and then INA may toggle back to the low voltage state.

DC State with INA=0 and INB=1:

During normal operation with INA=0 and with INB=VDD, OUTN will be at DVDD, NOUTN will be at 0, node A (n3) will be at DVDD, node B (n4) will be at 0, OUTB will be at DVDD, and OUTA will be at 0.

Input Toggling High (INA=1 and INB=0):

When INA becomes VDD, and when INB becomes 0, transistor MN2 and transistor MP8 turns ON, and transistor MN1 turns OFF, and transistor MP9 then becomes weak, which reduces contention. When OUTN node (n2) starts discharging, and when OUTN node (n2) voltage is reduced by the threshold (Vt) voltage, transistor MP2 will be turned ON and raises voltage at node NOUTN (n1) towards DVDD through transistor MP1. Also, when NOUTN (n1) becomes DVDD, transistors MP7 and MP5 turn OFF, and OUTN (n2) goes to 0, which makes the second stage latch 212 toggle the (high/low) states at node A (n3) and B (n4) to 0 and DVDD, respectively. Also, once node B (n4) becomes DVDD, OUTB (n5) will become 0 through transistor MN5, and OUTA (n6) will become DVDD through transistor MP13, which makes transistor MP1 turn OFF, and transistor MP4 will be turned ON.

Input Toggling Back Low (INA=0 and INB=1):

When INA becomes 0, and when INB becomes VDD, transistor MN1 and transistor MP9 turn ON, and transistor MN2 turns OFF, and then transistor MP8 becomes weak, which reduces contention. When NOUTN (n1) starts discharging, and when NOUTN (n1) voltage is reduced by the threshold (Vt) voltage, transistor MP5 will be turned ON and raises the voltage at node OUTN (n2) towards DVDD through transistor MP4. Also, when OUTN (n2) becomes DVDD, transistors MP6 and MP2 turn OFF, and NOUTN (n1) goes to 0, which makes the second stage latch 212 to toggle (high/low) states at node A (n3) and node B (n4) to DVDD and 0, respectively. Also, once node B (n4) becomes 0, OUTB (n5) will become DVDD through transistor MP12, and OUTA (n6) will become 0 through transistor MN6, which makes transistor MP4 turn OFF, and transistor MP1 will be turned ON.

Figure 3:
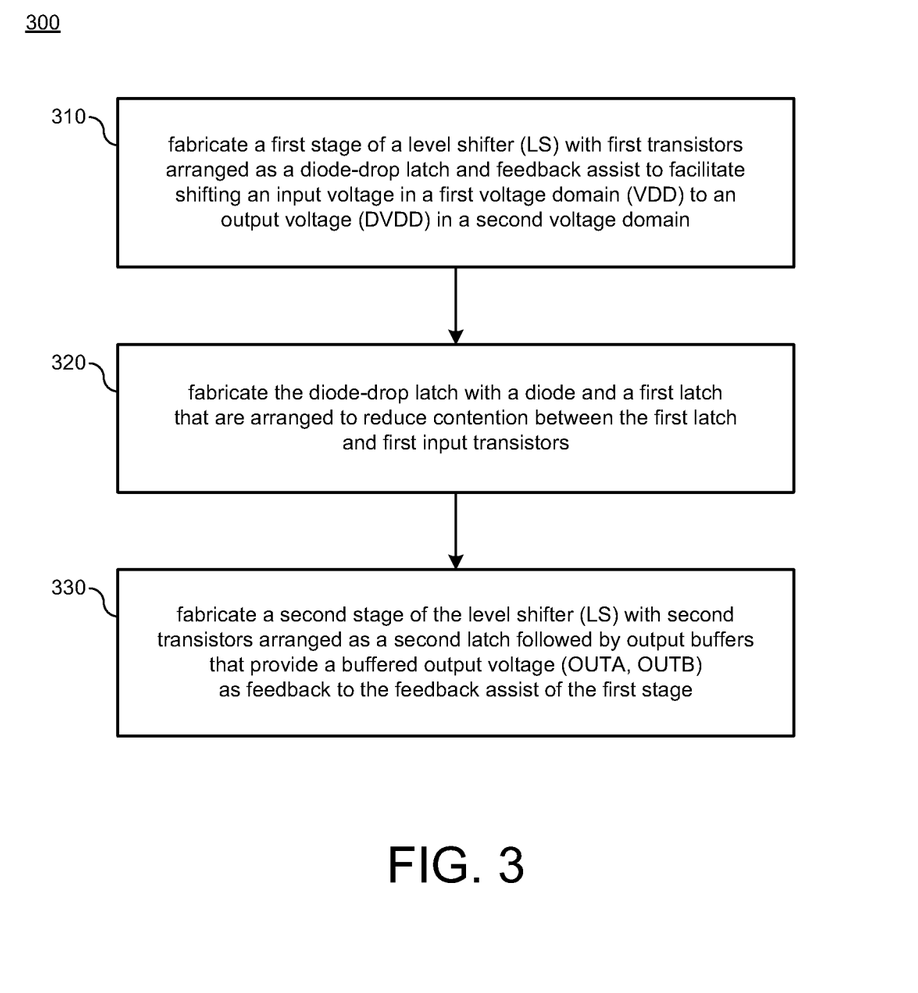
FIG. 3 illustrates a process flow diagram of a method for providing a level shifter having a diode-drop latch in accordance with implementations described herein.

FIG. 3 illustrates a process diagram of a method 300 for providing a level shifter having a diode-drop latch with feedback assist in accordance with various implementations described herein.

It should be understood that even though method 300 indicates a particular order of operation execution, in some cases, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1A-2B. Also, if implemented in software, method 300 may be implemented as a program or software instruction process configured for providing a level shifter with a diode-drop latch, as described herein. Further, if implemented in software, instructions related to implementing the method 300 may be stored in memory and/or a database. For instance, a computer or various other types of computing devices having a processor and memory may be configured to perform method 300.

As described and shown in reference to FIG. 3, method 300 may be used for fabricating and/or manufacturing, or causing to be fabricated and/or manufactured, an integrated circuit (IC) that implements level shifting schemes and techniques as described herein that are related to providing a level shifter with diode-drop latch circuitry and/or various associated devices, components and circuits.

At block 310, method 300 may fabricate a first stage of a level shifter (LS) with first transistors arranged as a diode-drop latch and feedback assist to facilitate shifting an input voltage (INA, INB) in a first voltage domain (VDD) to an output voltage (OUTN, NOUTN) in a second voltage domain (DVDD). In reference to upshifting the input voltage, the second voltage domain (DVDD) is greater than the first voltage domain (VDD). In some instances, the input voltage (INA, INB) in the first voltage domain (VDD) may refer to a low core voltage (VDD), and the output voltage (OUTN, NOUTN) in the second voltage domain (DVDD) may refer to a high output voltage (DVDD) that is greater than the low core voltage (VDD).

At block 320, method 300 may fabricate the diode-drop latch with a diode and a first latch that are arranged to reduce contention between the first latch and first input transistors. In this instance, the diode-drop latch and the feedback assist may be used to enable activation of the first input transistors with the input voltage (INA, INB). In addition, the diode drop latch of the first stage may include a diode-coupled transistor that is arranged to operate as the diode, and the diode drop latch may include additional transistors that are arranged to operate as the first latch. Also, the diode-drop latch of the first stage may include latch input transistors that are coupled between the first latch and the first input transistors, and the latch input transistors may include a first latch input transistor and a second latch input transistor. The first latch input transistor may be activated by a first input voltage (INB) of the input voltages (INA, INB), and the second latch input transistor may be activated by a second input voltage (INA) of the input voltages (INA, INB).

At block 330, method 300 may fabricate a second stage of the level shifter (LS) with second transistors that are arranged as a second latch followed by output buffers that provide a buffered output voltage (OUTA, OUTB) as feedback to the feedback assist of the first stage. The second transistors of the second stage may be arranged to support operating frequencies above a predetermined operating frequency (e.g., operating frequencies above 200 MHz). The second stage may use the second latch to enable the operating frequencies above the predetermined operating frequency, and the second stage may use the output buffers to provide the feedback in the second voltage domain (DVDD) to the first stage. The second stage may include second input transistors including a third input transistor and a fourth input transistor. The third input transistor may be activated by a first output voltage (NOUTN) of the output voltages (OUTN, NOUTN), and also, the fourth input transistor may be activated by a second output voltage (OUTN) of the output voltages (OUTN, NOUTN).

Described herein are various implementations of an integrated circuit. The integrated circuit may include a first stage having first transistors arranged as a diode, a first latch and feedback assist to facilitate shifting an input voltage in a first voltage domain to an output voltage in a second voltage domain that is greater than the first voltage domain. The first stage uses the diode and the first latch to reduce contention between the first latch and input transistors. The diode, the first latch and the feedback assist enable activation of the input transistors with the input voltage. The integrated circuit may include a second stage having second transistors arranged as a second latch followed by output buffers that provide a buffered output voltage as feedback to the feedback assist of the first stage.

Described herein are various implementations of an integrated circuit. The integrated circuit may include a first stage having first transistors arranged to facilitate shifting a core voltage in a first voltage domain to an input-output (IO) voltage in a second voltage domain that is greater than the first voltage domain. The first stage includes a diode drop latch having a diode and a first latch arranged to reduce contention between the first latch and input transistors and to enable turn-on of the input transistors at the low core voltage. The integrated circuit may include a second stage having second transistors arranged to provide support for higher frequencies. The second stage uses a second latch to enable the higher frequencies, and the second stage uses output buffers to provide feedback voltage of a higher output voltage to the first stage.

Described herein are various implementations of a method. The method may include fabricating a first stage of a level shifter with first transistors arranged as a diode-drop latch and feedback assist to facilitate shifting an input voltage in a first voltage domain to an output voltage in a second voltage domain that is greater than the first voltage domain. The diode-drop latch has a diode and a first latch arranged to reduce contention between the first latch and input transistors. The diode-drop latch and the feedback assist enable activation of the input transistors with the input voltage. The method may include fabricating a second stage of the level shifter with second transistors arranged as a second latch followed by output buffers that provide a buffered output voltage as feedback to the feedback assist of the first stage.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a first stage having a diode, a first latch and a feedback assist circuit, wherein the first stage facilitates shifting an input voltage in a first voltage domain to an output voltage and a buffered output voltage, wherein the output voltage and the buffered output voltage are in a second voltage domain that is greater than the first voltage domain,
wherein the diode is coupled between a source voltage and the first latch, wherein the first latch is coupled between the diode and first input transistors, wherein the feedback assist circuit is coupled between the source voltage and the first input transistors, wherein the first input transistors are activated by the input voltage, and wherein the feedback assist circuit provides the output voltage when activated by the buffered output voltage; and
a second stage having second input transistors and a second latch along with output buffers that provide the buffered output voltage as feedback to enable activation of the feedback assist circuit of the first stage,
wherein the second latch is coupled between the source voltage and the second input transistors, and wherein the second input transistors are activated by the output voltage from the feedback assist circuit.

2. The integrated circuit of claim 1, wherein the integrated circuit comprises a level shifter, and wherein the level shifter comprises the first stage and the second stage.

3. The integrated circuit of claim 1, wherein a combination of the diode and the first latch refer to a diode-drop latch, wherein the diode comprises a diode-coupled transistor arranged to operate as the diode, and wherein the first latch comprises multiple transistors arranged to operate as the first latch.

4. The integrated circuit of claim 1, wherein the feedback assist circuit of the first stage includes first feedback assist transistors and second feedback assist transistors arranged to receive the output voltage and the buffered output voltage and provide the output voltage to the first input transistors and the second input transistors.

5. The integrated circuit of claim 1, wherein the input voltage refers to multiple input voltages, wherein the first input transistors of the first stage have a first input transistor and a second input transistor, wherein the first input transistor is activated by a first input voltage of the multiple input voltages, and wherein the second input transistor is activated by a second input voltage of the multiple input voltages.

6. The integrated circuit of claim 5, wherein the output voltage refers to multiple output voltages, wherein the second stage has the second input transistors including a third input transistor and a fourth input transistor, wherein the third input transistor is activated by a first output voltage of the multiple output voltages, and wherein the fourth input transistor is activated by a second output voltage of the multiple output voltages.

7. The integrated circuit of claim 1, wherein the input voltage refers to multiple input voltages, wherein the first latch has latch input transistors coupled between the first latch and the first input transistors, wherein the latch input transistors include a first latch input transistor and a second latch input transistor, wherein the first latch input transistor is activated by a first input voltage of the multiple input voltages, and wherein the second latch input transistor is activated by a second input voltage of the multiple input voltages.

8. The integrated circuit of claim 1, wherein the output voltage refers to multiple output voltages, wherein a first output buffer of the output buffers of the second stage provide a first output voltage of the multiple output voltages as a first feedback voltage of the feedback to the feedback assist circuit of the first stage, and wherein a second output buffer of the output buffers of the second stage provides a second output voltage of the multiple output voltages as a second feedback voltage of the feedback to the feedback assist circuit of the first stage.

9. The integrated circuit of claim 1, wherein the input voltage in the first voltage domain refers to a low core voltage, and wherein the output voltage in the second voltage domain refers to a high output voltage that is greater than the low core voltage.

10. The integrated circuit of claim 1, wherein the second stage is configured to support operating frequencies above a predetermined operating frequency, wherein the second stage uses the second latch to enable the operating frequencies above the predetermined operating frequency, and wherein the second stage uses the output buffers to provide the feedback in the second voltage domain to the first stage.

11. An integrated circuit, comprising:
a first stage that facilitates shifting a core voltage in a first voltage domain to an input-output (IO) voltage and a feedback voltage, wherein the IO voltage and the feedback voltage are in a second voltage domain that is greater than the first voltage domain,
wherein the first stage includes a diode drop latch having a diode and a first latch coupled in series between a source voltage and first input transistors, and wherein the first input transistors are activated with the core voltage; and
a second stage having a second latch, second input transistors and output buffers that provide the feedback voltage of a higher output voltage,
wherein the output buffers provide the feedback voltage based on output from the second latch when the second input transistors are activated by the IO voltage from the first stage.

12. The integrated circuit of claim 11, wherein the diode comprises a diode-coupled transistor, wherein the diode drop latch of the first stage includes the diode-coupled transistor that is arranged to operate as the diode, and wherein the diode drop latch includes multiple transistors that are arranged to operate as the first latch.

13. The integrated circuit of claim 11, wherein the core voltage refers to multiple core voltages, wherein the diode-drop latch of the first stage has latch input transistors coupled between the first latch and the first input transistors, wherein the latch input transistors include a first latch input transistor and a second latch input transistor, wherein the first latch input transistor is activated by a first core voltage of the multiple core voltages, and wherein the second latch input transistor is activated by a second core voltage of the multiple core voltages.

14. The integrated circuit of claim 11, wherein the core voltage in the first voltage domain refers to a low core voltage, and wherein the IO voltage in the second voltage domain refers to the higher output voltage that is greater than the low core voltage.

15. The integrated circuit of claim 11, wherein the second stage is configured to support operating frequencies above a predetermined operating frequency, wherein the second stage includes the second latch that is configured to enable the operating frequencies above the predetermined operating frequency, and wherein the second stage includes the output buffers that are configured to provide the feedback voltage in the second voltage domain to the first stage.

16. A method, comprising:
fabricating a first stage of a level shifter with a diode-drop latch and a feedback assist circuit to facilitate shifting an input voltage in a first voltage domain to an output voltage and a feedback voltage, wherein the output voltage and the feedback voltage are in a second voltage domain that is greater than the first voltage domain,
wherein the diode-drop latch has a diode and a first latch coupled in series between a source voltage and first input transistors, wherein the first input transistors are activated with the input voltage, and wherein the feedback assist circuit provides the output voltage to the first input transistors when activated by the feedback voltage; and
fabricating a second stage of the level shifter with a second latch and output buffers that provide a buffered output voltage as the feedback voltage to the feedback assist circuit of the first stage.

17. The method of claim 16, wherein the diode drop latch of the first stage includes a diode-coupled transistor arranged to operate as the diode, and wherein the diode drop latch includes multiple transistors arranged to operate as the first latch.

18. The method of claim 16, wherein the diode-drop latch of the first stage has latch input transistors coupled between the first latch and the first input transistors, wherein the latch input transistors include a first latch input transistor and a second latch input transistor, wherein the input voltage refers to multiple input voltages, wherein the first latch input transistor is activated by a first input voltage of the multiple input voltages, and wherein the second latch input transistor is activated by a second input voltage of the multiple input voltages.

19. The method of claim 16, wherein the input voltage in the first voltage domain refers to a low core voltage, and wherein the output voltage in the second voltage domain refers to a high output voltage that is greater than the low core voltage.

20. The method of claim 16, wherein the second latch is configured to enable operating frequencies above a predetermined operating frequency, and wherein the second stage includes the output buffers that are configured to provide the feedback voltage in the second voltage domain to the first stage.

* * * * *